United States Patent
Torek

Patent Number: 6,150,277
Date of Patent: Nov. 21, 2000

[54] METHOD OF MAKING AN OXIDE STRUCTURE HAVING A FINELY CALIBRATED THICKNESS

[75] Inventor: Kevin J. Torek, Meridian, Id.

[73] Assignee: Micron Technology, Inc., Boise, Id.

[21] Appl. No.: 09/385,156

[22] Filed: Aug. 30, 1999

[51] Int. Cl.⁷ .................................................. H01L 21/461
[52] U.S. Cl. ............................... 438/705; 438/770; 430/5
[58] Field of Search ........................ 438/705, 770, 438/787; 430/5, 322, 323

[56] References Cited

U.S. PATENT DOCUMENTS

| | | |
|---|---|---|
| 5,225,034 | 7/1993 | Yu et al. . |
| 5,234,540 | 8/1993 | Grant et al. . |
| 5,240,522 | 8/1993 | Tanaka et al. . |
| 5,242,524 | 9/1993 | Leach et al. . |
| 5,314,843 | 5/1994 | Yu et al. . |
| 5,376,483 | 12/1994 | Rolfson . |
| 5,407,526 | 4/1995 | Danielson et al. . |
| 5,413,941 | 5/1995 | Koos et al. . |
| 5,439,553 | 8/1995 | Grant et al. . |
| 5,554,939 | 9/1996 | Hirae et al. ............................. 324/753 |
| 5,576,126 | 11/1996 | Rolfson . |
| 5,637,185 | 6/1997 | Murarka et al. . |
| 5,685,951 | 11/1997 | Torek et al. . |
| 5,781,994 | 7/1998 | Fouillet et al. ........................ 29/890.1 |
| 5,783,495 | 7/1998 | Li et al. . |
| 5,946,595 | 8/1999 | Doan et al. ............................. 438/659 |
| 5,965,035 | 10/1999 | Hung et al. ............................. 216/72 |
| 5,994,225 | 11/1999 | Liu et al. ............................... 438/694 |

Primary Examiner—Matthew Smith
Assistant Examiner—Robert A. Hullinger
Attorney, Agent, or Firm—Knobbe, Martens, Olson & Bear, LLP

[57] ABSTRACT

A process of growing silicon oxide to a highly calibrated thickness is provided. In one embodiment, a silicon precursor material is deposited to a first thickness on a substrate, such as a fused glass substrate used for forming microlithography masks. The precursor material is then selectively exposed to ionization and the non-ionized portions of the precursor material are then selectively etched leaving only the implanted portion of the precursor material of the first thickness. The implanted material is then oxidized resulting in an oxide structure having a thickness that is directly correlated to the initial thickness and the coefficient of oxidation. In one embodiment, a selective etch, such as TMAH, is used to remove unimplanted silicon which results in less than one percent etching of the implanted silicon. Hence, the process can be used to form phase shift structures on phase shift photolithography masks wherein the thickness of the phase shift structure can be formed to within a specific tolerance to achieve a desired phase shift of light traveling through the phase shift structure.

16 Claims, 2 Drawing Sheets

METHOD OF MAKING AN OXIDE STRUCTURE HAVING A FINELY CALIBRATED THICKNESS

BACKGROUND OF THE INVENTION

1. Field of the Invention

The present invention relates to semiconductor processing technology and, in particular, concerns a process whereby oxide structures can be grown to have finely calibrated thicknesses which has particular application in deep ultraviolet phase shift masks used in photolithography.

2. Description of the Related Art

Over the past 20 years, the semiconductor industry has seen a tremendous increase in the scale of integration of integrated circuits formed using semiconductor processing techniques. As the scale of integration has increased, so has the need for processing techniques that allow for the formation of devices and structures of increasingly smaller and smaller sizes. Moreover, there has also been an increased need for process techniques that will allow for the formation of structures on a substrate that are positioned closer and closer to each other.

The primary technique by which structures are formed on a substrate in semiconductor processing is known as photolithography. Generally, a photosensitive agent, known as a photoresist, is positioned on an upper surface of a substrate and a mask is positioned over the photoresist. The mask is typically patterned with opaque regions and transmitting regions so that light can be selectively provided to regions of the photoresist positioned on top of the wafer. The photoresist is light sensitive such that the regions of the photoresist receiving the light become exposed. Exposure of the photoresist chemically changes the material in this region thereby allowing for selective removal of the photoresist. Once the photoresist has been removed, structures can be formed on the substrate or within the regions of the substrate corresponding to the removed areas of the photoresist.

As device dimensions have significantly decreased and the scale of integration has significantly increased, there has been an ongoing need for lithography techniques that allow for the exposure of smaller and smaller regions of the photoresist and also regions of the photoresist that are positioned very close to one another.

One particular problem that occurs with masks that are projecting light onto regions of photoresist that are very closely positioned together is that it can be difficult to selectively expose well-defined regions of the photoresist to the light without interference from light from adjacent openings in the mask. Moreover, as the openings in the mask are positioned closer and closer to each other, diffraction of the light that is travelling through the adjacent openings in the mask can result in the area between the two regions of the photoresist material on the substrate that are to be exposed also being exposed by the diffracting light.

To address this particular problem, prior art photolithography masks have been developed wherein the light that is traveling through one opening in the mask also travels through an additional layer of light transmitting material such that the light emanating therefrom is 180 degrees out of phase from the light traveling through the adjacent mask opening. The combination of diffracted light emanating from adjacent openings in the phase shift mask results in the light traveling to the area between the two regions of the photoresist material that are to be exposed destructively interfering such that the photoresist in this area is not exposed. Moreover, phase shifting the light also reduces the effect of light traveling through one mask opening affecting the exposure of the photoresist in the region corresponding to the adjacent mask opening. Hence, phase shift masks can be used to produce more highly defined integrated circuits with semiconductor structures placed much closer together thereby permitting increasing the scale of integration.

While phase shift photolithography has enhanced the resolution and depth of image of lithographic techniques, it underscores the need for the ability to produce very thin structures having a very highly calibrated thickness of material. As discussed above, there is an on-going need for the ability to form particular structures having very high thickness tolerances in all phases of semiconductor processing. In the particular application of phase shift photolithography, it is desirable to be able to produce phase shifting light transparent structures having a specific thickness so that the desired degree of phase shift of the light traveling through the mask opening can be obtained in order to achieve desired destructive interference between the light traveling through adjacent openings in the mask. The phase shift of the light is, of course, dependent upon the material through which the light is traveling and also the thickness of this material. However, using prior art techniques for forming structures of a light transparent material, such as silicon oxide, it is difficult to form very small structures with a desired degree of tolerance for the thickness of the structure. For example, using deep UV phase shift microlithography, it is desirable to be able to grow phase shift structures having a tolerance within approximately 12 Angstroms of the wavelength of the deep UV light (e.g., approximately 400–1200 Angstroms). Hence, there is a need for an ability to form structures, and in particular light transmitting structures, to within very high tolerances.

SUMMARY OF THE INVENTION

The aforementioned needs are satisfied by the process of producing finely calibrated structures of the present invention. In one aspect, the present invention comprises a process of forming a structure having a finely calibrated thickness comprising forming a structure of a first precursor material of a first thickness on a substrate and then subsequently oxidizing the precursor structure such that the resulting structure has a selected thickness based upon the first thickness of the precursor material and the known expansion coefficient upon oxidation of the precursor material. In one embodiment, the finely calibrated structure is formed on at substrate by depositing silicon on the substrate, and then selectively ion implanting at region of the deposited silicon. Subsequently, the silicon is selectively etched so that the non-implanted silicon is removed and the ion implanted silicon is then oxidized to produce a silicon oxide structure of a desired thickness. In this way, a silicon oxide structure can be grown to within a tolerance of a desired thickness. In one embodiment, an etch is used to remove the non-implanted silicon where the etch is highly selective of the non-implanted silicon so that the etch thins the implanted silicon only to the tolerance value.

In another aspect of the invention, a photoresist mask is provided. In this aspect of the invention, the photoresist mask is comprised of a light transmitting substrate and one or more layers of light masking material which is patterned so as to selectively allow light to transmit through the light masking materials into the light transmitting substrate and a light transmitting structure is positioned on the substrate so that light travelling through an opening in the masking material travels through the light transmitting structure. The light transmitting structure is formed to a thickness selected so that the light travelling through the light transmitting structure and emanating from the mask is a selected degree out of phase from light that is emanating from an adjacent opening in the mask. In one embodiment, the light transmitting phase shifting structure is formed so that the thickness is within less than or equal to approximately 1% of the wavelength of the light travelling through the mask.

The present invention provides both a process for growing a structure of a finely calibrated thickness and also a structure having a finely calibrated thickness that is particularly adaptable for use in the formation of microlithography phase shift masks. These and other objects and advantages of the present invention will become more fully apparent from the following description taken in conjunction with the accompanying drawings.

DETAILED DESCRIPTION OF THE PREFERRED EMBODIMENTS

Reference will now be made to the drawings wherein like numerals refer to like parts throughout. In one aspect, this embodiment discloses a process of growing an oxide structure to a finely calibrated thickness on a substrate 100. In one embodiment, the substrate 100 can be a semiconductor substrate upon which the finely calibrated oxide structure is to be formed. In another embodiment, the substrate is comprised of a light transparent substrate, such as a fused silica glass or quartz material, such as the substrates formed for use in microlithography masks.

Figure 1A:
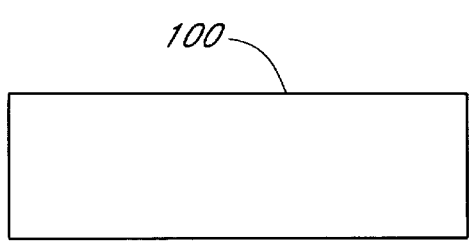
FIGS. 1A–1G are diagrammatic representations of a process of forming a silicon oxide structure having a finely calibrated thickness.
Figure 1E:
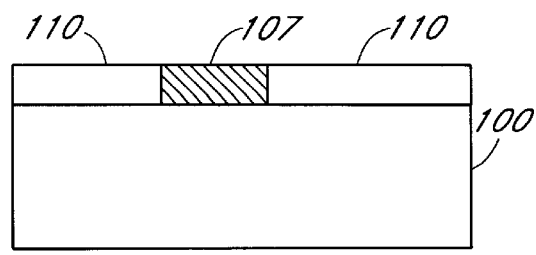
Figure 1B:
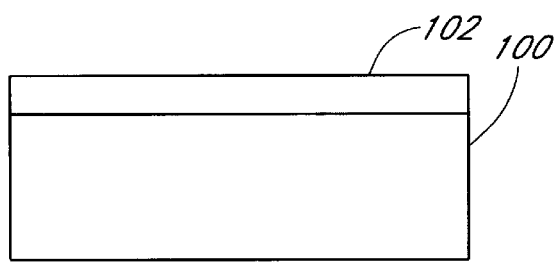

In this embodiment, as shown in FIGS. 1A and 1B, a layer of precursor material 102 which is preferably a silicon precursor material and, in this embodiment is comprised of silicon, is deposited to a first thickness. As will be discussed in greater detail below, the first thickness of the precursor material is selected so that upon oxidation, the thickness of the resulting oxidized structure is within close tolerances of a desired thickness. As is generally understood in the art, there is an expansion coefficient of the precursor material 102 that allows for relatively accurate determination of the final thickness of the resulting oxide structure as a result of oxidation of the silicon precursor material.

Figure 1F:
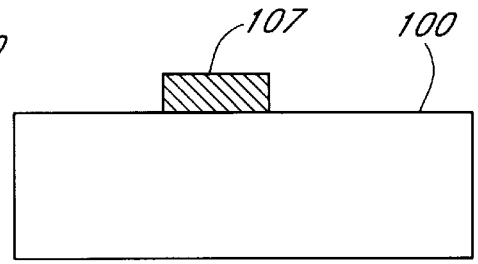
Figure 1C:
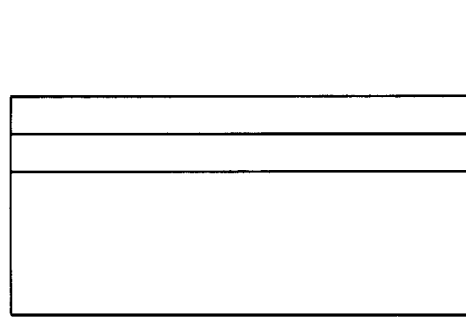

In one embodiment contemplated for use with deep ultraviolet lithography (,with Deep UV light of approximately either 2480 Å or 1930 Å wavelength), the precursor material 102 is deposited using well-known CVD techniques to an approximate thickness of 425 Å or 546 Å depending on the deep UV wavelength to be used. As shown in FIG. 1C, once the layer of precursor material 102 has been formed on the substrate 100, a layer of photoresist 104 is then deposited on the layer of precursor material 102. The photoresist material 104 is deposited using well-known photoresist deposition techniques to thereby allow for selective patterning and removal of the photoresist material 104 to expose a selected region 106 of the precursor material 102. A region of the photoresist layer 104 that corresponds to the region 106 of the precursor material 102 is transformed by exposure to light from a photolithography mask (not shown) in a manner well known in the art.

Figure 1G:
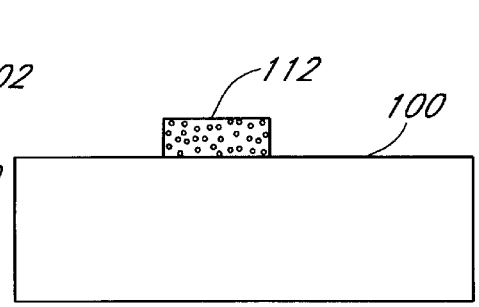
Figure 1D:
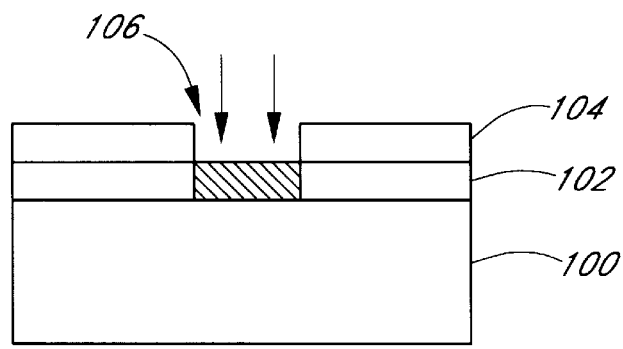

As shown in FIG. 1D, a region of the photoresist material 104 is selectively removed using well-known photolithography techniques so as to expose the region 106 of the layer of silicon precursor material 102. In this embodiment, the exposed region 106 of silicon precursor material 102 is ionized to form an ionized or implanted region 107 of the silicon precursor material 102. In the preferred embodiment, a well-known ion implanter which uses argon ions is used to ionize the exposed region 106 such that the concentration of ions is preferably $1 \times 10^{14}$ ions per cubic centimeter or greater.

As shown in FIG. 1E, the remaining photoresist material 104 is then removed in the manner well known in the art. At this point, the precursor material 102 is comprised of the implanted region 107 and two non-implanted regions 110 which are preferably non-implanted silicon regions. In this embodiment, the non-implanted regions 110 are preferably selectively etched so as to remove the non-implanted regions 110 of the precursor material 102 from the substrate 100 leaving the ionized implanted region 107 in the manner shown in FIG. 1F.

In one embodiment, a highly selective wet etch is used that is highly selective so as to remove the non-implanted precursor material 102 forming the regions 110. In one embodiment, the non-implanted precursor material 102 is removed by exposing the silicon precursor material 102 to TMAH (tetra methyl ammonium hydroxide) which selectively removes the unimplanted deposited precursor material 110 without significantly etching the implanted silicon region 107 or the underlying fused silicon glass mask substrate 100. In this embodiment, tetra methyl ammonium hydroxide can be used so as to remove substantially all of a 425 Å or 546 Å thick layer of non-implanted regions 110 while limiting the etching of the implanted region 107 of the silicon precursor material to less than one percent of the wavelength of light used for photolithography, i.e., 10 to 12 Angstroms for deep ultraviolet photolithography.

Hence, the non-implanted regions 110 of the precursor material 102 can thus be removed with reduced thinning of the implanted region 107 of the silicon precursor material 102. The thinning of the implanted region 107 is a significant factor in the tolerance to which a structure can be formed. In this embodiment, the ratio of the removal rates of the non-implanted regions 110 to the implanted silicon region 107 is at least approximately 40 to 1. In this way, an implanted silicon precursor structure 107 can be formed on a substrate to have a very specific thickness that is relatively unaffected during the etching process to remove the remaining unimplanted precursor material.

As shown in FIG. 1G, the remaining implanted silicon precursor structure 107 is then oxidized into a silicon oxide structure 112 using well-known oxidation techniques such as wet oxidation. This results in the implanted silicon material being transformed into a silicon oxide ($SiO_2$) material that, in one embodiment, will allow for the transmission of certain wavelengths of light.

It is understood that oxidation of silicon will result in the expansion of the structure by a well-known amount which is dictated by the oxidation expansion coefficient for the material. For silicon, when oxidized, the dimensions increase according to an expansion coefficient of approximately 2.272. Hence, using the process of this embodiment, a silicon oxide structure 112, can be formed by depositing a layer of precursor silicon of a thickness that is selected so that upon oxidation the resulting thickness after the expansion due to oxidation is within a tolerance of a desired thickness. As discussed above, the relatively precise tolerance of thickness of the oxidized structure 112 is dependent upon the use of a selective etch to remove the non-implanted regions. The tolerance of the thickness is strongly dependent upon the selectivity of the etchant. Using the numbers provided above, depositing the silicon precursor material to a thickness of approximately 425 Angstroms or 546 Angstroms results in a silicon oxide structure of approximately 965 Angstroms or 1240 Angstroms respectively due to the expansion coefficient of silicon upon oxidation of approximately 2.272.

This technique of forming the silicon oxide structure 112 has particular adaptability for use in phase shift structures in phase shift lithography masks. In particular, silicon oxide is transparent to light but has a known effect upon the phase of the light that is traveling therethrough. The index of refraction of the material, along with the thickness of the material, dictates the degree of phase shifting that will occur in light that is traveling through such a structure 112.

In particular, change of the phase of the light is proportional to the change in path of the light through the phase shift structure 112. The change in the path of the light is the result of the light being refracted when entering the phase shift structure 112. The degree of refraction is dependent upon the index of refraction which for silicon oxide ($SiO_2$) formed in the above described fashion is approximately 1.46. The index of refraction allows for determination of the angle of refraction with which the light travels through the phase shifting structure 112. Consequently, the thickness of the phase shifting structure 112 is directly proportional to the changed path of the light which is, in turn, directly proportional to the change in phase of the light. By being able to precisely control this thickness, the phase of the light travelling through the phase shifting structure 112 can also be precisely controlled.

In particular, the process described in conjunction with FIGS. 1A–1G results in the formation of a silicon oxide structure that is approximately 965 or 1240 Angstroms thick. This value has been selected as it is approximately one half of the wavelength of the deep UV light that is used in deep UV photolithography (i.e. deep UV lithography uses light having a wavelength of approximately 2480 or 1930 Angstroms). The use of the tetra methyl ammonium hydroxide etch to remove the non-implanted regions results in an etching process than removes the non-implanted regions at a rate of 40 times greater than the removal of the implanted regions. Hence, the thinning of the implanted regions that ultimately results in the silicon oxide structure can be limited to less than approximately 25 Angstroms or more preferably within approximately 10–12 Angstroms of the desired thickness. Hence, a very high tolerance phase shift structure can be formed as will be described in greater detail hereinbelow.

Figure 2:
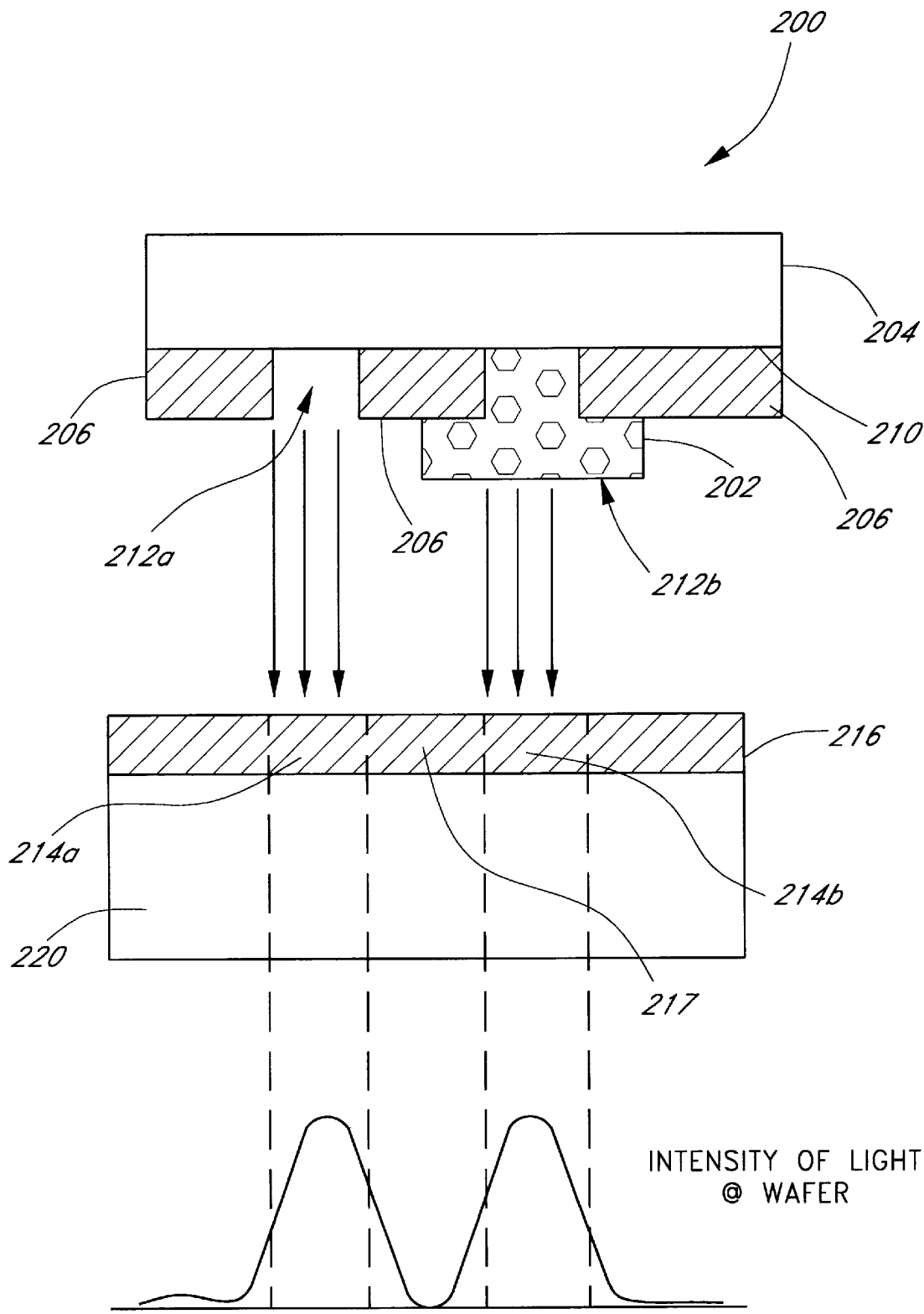
FIG. 2 is a diagrammatic illustration of one embodiment of a phase shift microlithography mask having a silicon oxide structure formed to a finely calibrated thickness positioned on the mask to thereby achieve a desired phase shift of light traveling therethrough.

FIG. 2 is a diagram which illustrates one exemplary photolithography mask 200 that incorporates one such silicon oxide phase shift structure 202. In particular, the photolithography mask 200 includes a substrate 204 formed of a light transmitting material, such as fused silica glass, having a uniform thickness. An opaque material 206, such as chromium, is deposited on an lower surface 210 using well known techniques and is then patterned and etched to form openings 212a, 212b through which light will travel. The light travels through the substrate 204 and then through the openings 212a, 212b in the opaque masking material 206 where the light impinges upon selected regions 214a, 214b of photoresist material 216 positioned on top of a semiconductor substrate 220.

As discussed above, with submicron devices, the openings 212a, 212b in the photolithography mask 200 may be positioned so close together that the light emanating from the openings 212a, 212b will illuminate a region 217 of the photoresist material 216 interposed between the regions 214a, 214b to be exposed. This problem of unintended illumination of the region 217 is particularly pronounced when the light emanating from the openings 212a, 212b of the mask 200 towards the regions 214a, 214b are of the same phase.

To address this particular problem, a phase shifting structure 202 is formed so as to be positioned adjacent the opening 212b. Preferably, the phase shifting structure 202 is a silica oxide structure formed using the techniques described above in connection with FIGS. 1A–1G. In particular, the structure 202 can be formed using the process of FIGS. 1A–1G and then the chromium material can be deposited using well-known processing techniques.

In particular, the phase shifting structure 202 is formed by depositing a layer of silicon precursor material so that the layer is deposited within the opening 212 to a desired thickness in a manner similar to the manner described above in connection with FIGS. 1A and 1B. The layer is then masked and selectively exposed so that a region of silicon precursor material positioned within the opening 212b and immediately adjacent the opening can be ionized in the manner described above in connection with FIGS. 1C and 1D. The non-ionized oxide material is then removed in a manner similar to the manner described above in connection with FIGS. 1E and 1F and the remaining ionized oxide material positioned within the opening 212b is then oxidized in a manner similar to the manner described above in connection with FIG. 1G.

In this way, the phase shift structure 202 of a silicon oxide material ($SiO_2$) can be formed to a very specific thickness such that the phase of the light travelling through the opening 212b can be shifted by a selected degree. It will be appreciated that the phase shift structure can be formed in the opening 212b in any of a number of manners without departing from the spirit of the present invention.

In this way, a phase shift structure 202 can be formed on a phase shift mask 200 within a very close tolerance of a desired thickness. As discussed above, the thickness of the structure 202 directly affects the degree in which the phase of the light traveling therethrough is shifted. By being able to precisely control the thickness of the structure 202 during the formation process, it is possible to form structures within a very close tolerance, e.g., within 12 Angstroms for deep ultraviolet photolithography, such that the phase of the light emanating from the opening 212b is precisely controlled with respect to the phase of the light emanating from the opening 212a to thereby have the light from each of the openings 212a, 212b to destructively interfere in the region 217 thereby inhibiting development of this portion of the photoresist 216. Hence, it is possible using the silicon oxide growth technique of the preferred embodiments to form photolithography masks that produce images on photoresist material positioned on a substrate that is much better defined and is of much closer tolerances.

It will be appreciated that while the foregoing description has described the process for forming a phase shift structure that results in an approximately 180 degree phase shift of deep UV photolithography light, the process of the described embodiment can be adapted to result in any of a number of different phase shifts of any of a number of different wavelengths of light without departing from the spirit of the present invention. Moreover, this process can be adapted for any of a number of different phase shifting masks including attenuated phase shift masks, rim shift phase shift masks, notch phase shift masks and a number of other phase shift structures known in the art. Moreover, the this process can be adapted to forming structures other than phase shift masks to precise thicknesses without departing from the spirit of the present invention.

Although the foregoing description of the preferred embodiments of the present invention has shown, described and pointed out the fundamental novel features of the invention, it will be understood that various omissions, substitutions, and changes in the form of the detail of the apparatus and method as illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A method of forming an oxidized structure having a thickness within a tolerance value of a desired thickness comprising:

forming a layer of precursor material to a first thickness on the substrate by depositing, silicon on a fused quartz glass substrate;

implanting a first region of the precursor material with an identifying species;

selectively etching the non-implanted regions of the precursor material;

oxidizing the implanted region of the precursor material so as to form an oxidized structure of a final thickness wherein the final thickness is dependent upon the first thickness and the expansion of the implanted precursor material as a result of oxidation and wherein the final thickness is within a selected tolerance of the desired thickness.

2. The method of claim 1, wherein the step of selectively implanting the precursor material comprises exposing the silicon layer to an ionizing impurity so as to produce a region of implanted silicon.

3. The method of claim 2, wherein the step of selectively implanting the precursor material comprises exposing the silicon layer to Argon gas so as to implant ionizing impurities to a concentration of at least $1\times10^{14}$ cm$^{-3}$.

4. The method of claim 2, wherein the step of selectively etching the non-implanted regions comprises using an etchant wherein the ratio of the removal rate of the non-implanted precursor material to the implanted precursor material is at least approximately 40 to 1.

5. The method of claim 4, wherein selectively etching the non-implanted regions of the precursor material comprises using a TMAH etch to remove the non-implanted silicon region.

6. The method of claim 5, wherein forming the layer of precursor material comprises forming a layer of silicon material to a thickness of approximately 425 Angstroms and wherein the step of using TMAH etch to remove the non-implanted precursor material results in less than approximately 25 Angstroms being removed from the implanted precursor material.

7. The method of claim 6, wherein forming the precursor material to a first thickness comprises depositing silicon to a thickness of either approximately 425 or 546 Angstroms, and wherein the selective etching and oxidation of the implanted region results in an oxidized structure that is within 10 to 12 Angstroms of a desired thickness of either approximately 965 or 1240 Angstroms.

8. A method of forming a phase shift oxide structure on a phase shift lithography mask, the method comprising:

forming a layer of precursor material to a first thickness on a first surface of the substrate of a mask;

implanting the first region of the precursor material with an identifying species;

selectively etching the non-implanted regions of the precursor material so that only a structure of the implanted precursor material remains on the first surface of the substrate of the mask; and oxidizing the implanted precursor structure wherein the oxidation of the implanted precursor material produces a phase shift structure of a final thickness that is selected so as to impart a desired phase shift on light travelling through the mask and the phase shift structure.

9. The method of claim 8, wherein forming a layer of precursor material comprises depositing silicon on a fused quartz glass substrate.

10. The method of claim 9, wherein the step of selectively implanting the precursor material comprises exposing the silicon layer to an ionizing impurity so as to produce a region of implanted silicon.

11. The method of claim 10, wherein the step of selectively implanting the precursor material comprises exposing the silicon layer to Argon gas so as to implant ionizing impurities to a concentration of at least $1\times10^{14}$ cm$^{-3}$.

12. The method of claim 11, wherein the step of selectively etching the non-implanted regions comprises using an etchant wherein the ratio of the removal rate of the non-implanted precursor material to the implanted precursor material is at least approximately 40 to 1.

13. The method of claim 12, wherein selectively etching the non-implanted regions of the precursor material comprises using a TMAH etch to remove the non-implanted silicon region.

14. The method of claim 13, wherein oxidizing the implanted precursor structure forms a silicon oxide structure having a final thickness that is selected to impart approximately a 180 degree phase change in light travelling therethrough.

15. The method of claim 8, wherein the phase shift structure has a thickness that is within a tolerance of less than or equal to approximately 1% of the wavelength of light used for photolithography.

16. The method of claim 15, wherein the oxidization of the implanted precursor structure results in a phase shift structure having a thickness within approximately 12 Angstroms of the desired thickness of the phase shift structure needed to produce a 180 degree phase shift for deep ultraviolet phase shift photolithography.

* * * * *